US012683124B2

(12) United States Patent
Herr et al.

(10) Patent No.: US 12,683,124 B2
(45) Date of Patent: Jul. 14, 2026

(54) SUBSTRATE PROCESSING APPARATUS USING PLASMA PHASE SHIFT

(71) Applicant: ASM IP Holding B.V., Almere (NL)

(72) Inventors: Songwhe Herr, Seongnam-si (KR); Jeongsu Lee, Pyeongtaek-si (KR); Dongok Shin, Suwon (KR); DaeYoun Kim, Seo-gu (KR)

(73) Assignee: ASM IP Holding B.V., Almere (NL)

( * ) Notice: Subject to any disclaimer, the term of this patent is extended or adjusted under 35 U.S.C. 154(b) by 55 days.

(21) Appl. No.: 18/963,894

(22) Filed: Nov. 29, 2024

(65) Prior Publication Data

US 2025/0166971 A1     May 22, 2025

Related U.S. Application Data

(63) Continuation-in-part of application No. 18/674,057, filed on May 24, 2024.

(60) Provisional application No. 63/469,671, filed on May 30, 2023.

(51) Int. Cl.
    *H01J 37/32*          (2006.01)

(52) U.S. Cl.
    CPC .. *H01J 37/32174* (2013.01); *H01J 37/32889* (2013.01); *H01J 2237/3321* (2013.01)

(58) Field of Classification Search
    None
    See application file for complete search history.

(56) References Cited

U.S. PATENT DOCUMENTS

| | | | | |
|---|---|---|---|---|
| 3,609,094 A | * | 9/1971 | Shaffer | C09K 11/771 |
| | | | | 252/301.4 P |
| 5,057,185 A | * | 10/1991 | Thomas, III | H01J 37/32082 |
| | | | | 204/298.34 |
| 6,020,686 A | * | 2/2000 | Ye | H01J 37/32091 |
| | | | | 315/111.21 |
| 6,155,199 A | * | 12/2000 | Chen | H01J 37/32174 |
| | | | | 118/723 R |
| 8,426,763 B2 | * | 4/2013 | Qin | H01J 37/32522 |
| | | | | 118/725 |
| 9,614,524 B1 | * | 4/2017 | Kawasaki | H01J 37/32165 |
| 10,264,663 B1 | * | 4/2019 | Long | H01J 37/32174 |
| 10,790,119 B2 | * | 9/2020 | Ma | H01J 37/32422 |
| 10,889,891 B2 | * | 1/2021 | L'Heureux | C23C 16/4412 |
| 10,950,421 B2 | * | 3/2021 | Valcore, Jr. | H01J 37/32183 |
| 10,998,170 B2 | * | 5/2021 | Yoshida | H01J 37/32082 |

(Continued)

*Primary Examiner* — Srinivas Sathiraju
(74) *Attorney, Agent, or Firm* — Snell & Wilmer L.L.P.

(57) ABSTRACT

A substrate processing system using plasma would be presented. The system may comprise a plurality of reaction chambers disposed on a platform, each of them being configured to process substrates; a plasma generator or generator coupled to the plurality of reaction chambers individually and configured to generate plasma or plasma power with a certain frequency and a certain phase, and further configured to provide the generated plasma or plasma power to the plurality of reaction chambers; and a control circuit connected to the plasma generator or generator and configured to adjust the phase of the plasma or plasma power generated by the plasma generator or generator; wherein, the control circuit is further configured to shift the phase of the generated plasma or plasma power provided to the plurality of reaction chambers independently.

16 Claims, 4 Drawing Sheets

(56)  References Cited

U.S. PATENT DOCUMENTS

| | | | | |
|---|---|---|---|---|
| 11,042,140 | B2 * | 6/2021 | Coumou | G05B 19/042 |
| 11,164,725 | B2 * | 11/2021 | Zhang | H01J 37/321 |
| 11,626,268 | B2 * | 4/2023 | Niu | H01J 37/32 |
| | | | | 315/111.51 |
| 11,728,141 | B2 * | 8/2023 | Rozenzon | H01J 37/3244 |
| | | | | 156/345.33 |
| 12,080,520 | B2 * | 9/2024 | Oliveti | H01J 37/32183 |
| 12,206,372 | B2 * | 1/2025 | Gruner | H03F 1/0211 |
| 2002/0121345 | A1 * | 9/2002 | Chen | C23C 16/507 |
| | | | | 156/345.48 |
| 2004/0086434 | A1 * | 5/2004 | Gadgil | H01J 37/32009 |
| | | | | 422/186.21 |
| 2004/0200499 | A1 * | 10/2004 | Harvey | C23C 16/4405 |
| | | | | 134/1.1 |
| 2005/0178748 | A1 * | 8/2005 | Buchberger, Jr. | |
| | | | | H01J 37/32183 |
| | | | | 219/121.48 |
| 2006/0196426 | A1 * | 9/2006 | Gluck | H01J 37/32082 |
| | | | | 118/723 R |
| 2010/0224321 | A1 * | 9/2010 | Grimbergen | H01J 37/32165 |
| | | | | 156/345.24 |
| 2010/0230053 | A1 * | 9/2010 | Nishio | H01J 37/32678 |
| | | | | 156/345.49 |
| 2010/0273277 | A1 * | 10/2010 | Qin | H01J 37/32522 |
| | | | | 438/798 |
| 2011/0192820 | A1 * | 8/2011 | Yeom | H10P 50/268 |
| | | | | 156/345.26 |
| 2011/0212624 | A1 * | 9/2011 | Hudson | H01J 37/32596 |
| | | | | 156/345.29 |
| 2014/0209090 | A1 * | 7/2014 | Snyder | F24S 80/60 |
| | | | | 126/643 |
| 2017/0011886 | A1 * | 1/2017 | Nozawa | C23C 16/4401 |
| 2017/0125220 | A1 * | 5/2017 | Chen | H01J 37/32422 |
| 2018/0330921 | A1 * | 11/2018 | Radomski | H01J 37/321 |
| 2018/0358208 | A1 * | 12/2018 | Ma | H01J 37/32422 |
| 2019/0068158 | A1 * | 2/2019 | Coumou | H03H 7/48 |
| 2019/0385822 | A1 * | 12/2019 | Marakhtanov | H01J 37/32165 |
| 2019/0391547 | A1 * | 12/2019 | Coumou | G05B 19/042 |
| 2020/0126765 | A1 * | 4/2020 | Ulrich | H01J 37/32183 |
| 2020/0168439 | A1 * | 5/2020 | Bhutta | H01J 37/32183 |
| 2020/0266650 | A1 * | 8/2020 | Cho | H02J 50/10 |
| 2021/0005431 | A1 * | 1/2021 | Ma | H01J 37/32422 |
| 2021/0074529 | A1 * | 3/2021 | Labanc | H01J 37/32174 |
| 2021/0090962 | A1 * | 3/2021 | Kapoor | H01J 37/32155 |
| 2021/0098233 | A1 * | 4/2021 | Kapoor | H01J 37/32091 |
| 2021/0113723 | A1 * | 4/2021 | Malinowski | A61L 2/10 |
| 2021/0217588 | A1 * | 7/2021 | Savas | H01J 37/32082 |
| 2021/0261148 | A1 * | 8/2021 | Li | G06F 18/29 |
| 2021/0264167 | A1 * | 8/2021 | Chen | G06V 10/82 |
| 2021/0311448 | A1 * | 10/2021 | Coumou | G05B 19/042 |
| 2022/0216838 | A1 * | 7/2022 | Gruner | H01J 37/32082 |
| 2023/0104096 | A1 * | 4/2023 | Oliveti | H01J 37/32935 |
| | | | | 315/111.21 |
| 2023/0298871 | A1 * | 9/2023 | Labanc | H01J 37/32174 |
| | | | | 156/345.48 |
| 2023/0411116 | A1 * | 12/2023 | Chen | H01J 37/32018 |
| 2024/0170258 | A1 * | 5/2024 | Tamamushi | H01J 37/32183 |
| 2024/0203711 | A1 * | 6/2024 | Kapoor | H01J 37/32183 |
| 2024/0404790 | A1 * | 12/2024 | Lee | H01J 37/32174 |
| 2025/0166971 | A1 * | 5/2025 | Herr | H01J 37/32174 |

* cited by examiner

SUBSTRATE PROCESSING APPARATUS USING PLASMA PHASE SHIFT

CROSS-REFERENCE TO RELATED APPLICATIONS

This application is a continuation-in-part of U.S. application Ser. No. 18/674,057, filed May 24, 2024, and entitled "WAFER PROCESSING APPARATUS USING PLASMA PHASE SHIFT." The '057 Application claims priority to U.S. Provisional Patent Application Ser. No. 63/469,671, filed May 30, 2023, and entitled WAFER PROCESSING APPARATUS USING PLASMA PHASE SHIFT, the disclosures of which are hereby incorporated by reference in its entirety.

FIELD OF INVENTION

The present disclosure relates to a substrate processing apparatus, particularly to an apparatus which uses plasma for processing substrates with multiple reaction chambers in a platform.

BACKGROUND OF THE DISCLOSURE

Some conventional substrate processing apparatuses share the same platform and bottom chamber among the reaction chambers. For example, one exemplary platform may comprise 4 reaction chambers.

A plasma in a reaction chamber may be generated by feeding radio frequency (RF) waves, i.e. plasma power, to or into a reaction chamber; the plasma power energizes gas molecules within the reaction chamber to form a plasma. The plasma power or plasma fed into the reaction chambers has a certain frequency and a certain phase. And due to this, each reaction chamber would affect other reaction chambers when in operation. More specifically, low plasma window, unstable plasma, low repeatability, no matching between reaction chambers (RCs), and center plasma may occur due to the interactions among the plasma waves of the reaction chambers.

FIG. 2 illustrates some aspects of the problems of the conventional apparatus with 4 chambers in one platform.

In portion (a), FIG. 2 illustrates the settings of a reaction chamber in sectional view.

A normal plasma 201 may be formed between an upper electrode 205 of a reaction chamber 200 and a substrate support 206. However, just below the substrate support 206, a bottom plasma 202 may be formed and below it, a shaft plasma 203 may also be formed.

Moreover, a center plasma 204 may also be created in the center of the platform (apparatus) 215 in portion (b) of FIG. 2.

This center plasma 204, 215 forms due to the constructive interference from the reaction chambers around the center 215, RC1 211, RC2 212, RC3 213, RC4 214 and this constructive interference can be seen in a graph 260's wave "A." The constructive interference is formed at a middle point 215 of the reaction chambers RC1 through RC4 211, 212, 213, 214.

An original wave "B" is depicted in portion (b) of FIG. 2 and each of the RCs are fed in the same wave "B" (220, 230, 240, 250). The resulting wave, i.e., center plasma "A" may have much bigger amplitude than that of the original wave "B".

This center plasma is induced from the waves fed into the surrounding RCs and it would affect the plasma quality and eventually the quality of substrates after processing.

Therefore, the present disclosure presents an apparatus for minimizing the center plasma.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In accordance with one embodiment there may be provided, a substrate processing system using plasma, the system comprising: a first reaction chamber, a second reaction chamber, a third reaction chamber, and a fourth reaction chamber disposed on a platform, each reaction chamber being configured to process substrates; a plasma generator or generator configured to generate plasma with a certain frequency and a certain phase, and further configured to provide the generated plasma or plasma power to the first reaction chamber, the second reaction chamber, the third reaction chamber and the fourth reaction chamber; and a control circuit connected to the plasma generator or generator and configured to adjust the phase of the plasma or plasma power generated by the plasma generator or generator; wherein, the control circuit is further configured to shift the phase of the generated plasma or plasma power provided to the first reaction chamber, the second reaction chamber, the third reaction chamber, and the fourth reaction chamber, independently.

In at least one aspect, the phase of the plasma or plasma power provided to the second reaction chamber is 90 degrees ahead of from that provided to the first reaction chamber, and the phase of the plasma or plasma power provided to the third reaction chamber is 90 degrees ahead of from that provided to the second reaction chamber, and the phase of the plasma or plasma power provided to the fourth reaction chamber is 90 degrees ahead of from that provided to the third reaction chamber.

In at least one aspect, the phase of the plasma or plasma power provided to the second reaction chamber is 90 degrees behind of that provided to the first reaction chamber, and the phase of the plasma or plasma power provided to the third reaction chamber is 90 degrees behind of that provided to the second reaction chamber, and the phase of the plasma or plasma power provided to the fourth reaction chamber is 90 degrees behind of that provided to the third reaction chamber.

In accordance with another embodiment there may be provided, a substrate processing system using plasma, the system comprising: a plurality of reaction chambers disposed on a platform, each of them being configured to process substrates; a plasma generator or generator coupled to the plurality of reaction chambers respectively and configured to generate plasma or plasma power with a certain frequency and a certain phase, and further configured to provide the generated plasma or plasma power to the plurality of reaction chambers; and a control circuit connected to the plasma generator or generator and configured to adjust the phase of the plasma or plasma power generated by the plasma generator; wherein, the control circuit is further configured to shift the phase of the generated plasma or plasma power provided to the plurality of reaction chambers independently.

In at least one aspect, the control circuit is further configured to shift the generated plasma or plasma power by (360/n) degrees for each of the plurality of reaction chambers, where n is the number of the reaction chambers.

In at least one aspect, the control circuit is further configured to change the phase of the generated plasma or plasma power provided to the plurality of reaction chambers in real-time.

In accordance with one embodiment there may be provided, a substrate processing system, the system comprising: a plurality of reaction chambers disposed on a platform, each reaction chamber being configured to process substrates. In some embodiments, the system further comprises at least one generator coupled to each of the reaction chambers and configured to provide plasma power comprising a frequency and a phase to each of the plurality of reaction chamber. In some embodiments, the at least one generator is electrically coupled to each of the plurality of reaction chambers.

The system is further configured to generate a plasma in each of the plurality of reaction chambers. The system further comprises at least one control circuit connected to at least one generator. In some embodiments, the system comprises a control circuit for each of the plurality of reaction chambers. In some embodiments, the system comprises a control circuit for the plurality of reaction chambers. The at least one control circuit is configured to independently control the phase of the plasma power provided to each reaction chamber. Further, the control circuit is configured to shift or offset the phase of the plasma power provided to each of the plurality of reaction chambers, independently.

In some embodiments, the system comprises a first reaction chamber, a second reaction chamber, a third reaction chamber, and a fourth reaction chamber. In some embodiments, the first/second/third/fourth reaction chambers are disposed on a platform and arranged in the shape of a square, such as the configuration shown in portion (b) of FIG. 2, with the first and third reaction chambers opposite from each other.

In at least one aspect, the control circuit is configured to shift the phase of the plasma power provided to the second reaction chamber about 90 degrees offset from the phase of the plasma power provided to the first reaction chamber, and shift the phase of the plasma power provided to the third reaction chamber about 90 degrees offset from the phase of the plasma power provided to the second reaction chamber, and shift the phase of the plasma power provided to the fourth reaction chamber about 90 degrees offset from the phase of the plasma power provided to the third reaction chamber.

In at least one aspect, the system is configured to shift the phase of the plasma power provided to the second reaction chamber about −90 degrees offset from the phase of the plasma power provided to the first reaction chamber, and shift the phase of the plasma power provided to the third reaction chamber about −90 degrees offset from the phase of the plasma power provided to the second reaction chamber, and shift the phase of the plasma power provided to the fourth reaction chamber about −90 degrees offset from the phase of the plasma power provided to the third reaction chamber.

In at least one aspect, the phase of the plasma power for the third reaction chamber is within about 0 degrees of the phase of the plasma power provided to the first reaction chamber and, for each of the second and fourth reaction chambers, the system is configured to shift the phase of the plasma power by about 180 degrees offset from the phase of the plasma power provided to the first reaction chamber.

In at least one aspect, the system is configured to shift the plasma power by about 195 degrees for the second reaction chamber, about 22 degrees for the third reaction chamber, and about 198 degrees for the fourth reaction chamber, with respect to the phase of the plasma power of the first reaction chamber.

In accordance with another embodiment there may be provided, a substrate processing system with n number of reaction chambers (RC), wherein the reaction chambers are labeled as $RC^1$, $RC^2$, . . . $RC^{n-1}$, $RC^n$, wherein $RC^1$ and $RC^n$ are adjacent and wherein $RC^x$ is adjacent to $RC^{x-1}$ and $RC^{x+1}$, where x is a natural number from 2 to n−1. In at least one aspect, the system is configured to shift the phase of plasma power provided to $RC^y$ by about (360/n) degrees offset from the phase of the plasma power provided to $RC^{y-1}$, wherein y is a natural number from 2 to n.

In at least one aspect, the system is further configured to change the each phase of the plasma power provided to the plurality of reaction chambers independently and in real-time.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Figure 1:
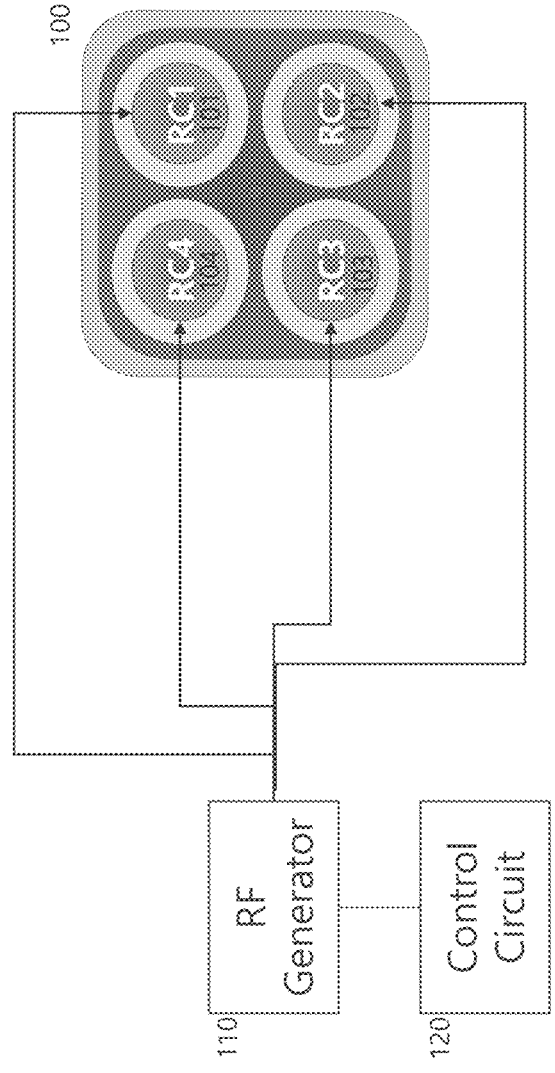
FIG. 1 illustrates the overview of an apparatus according to an embodiment of the present disclosure.
Figure 2:
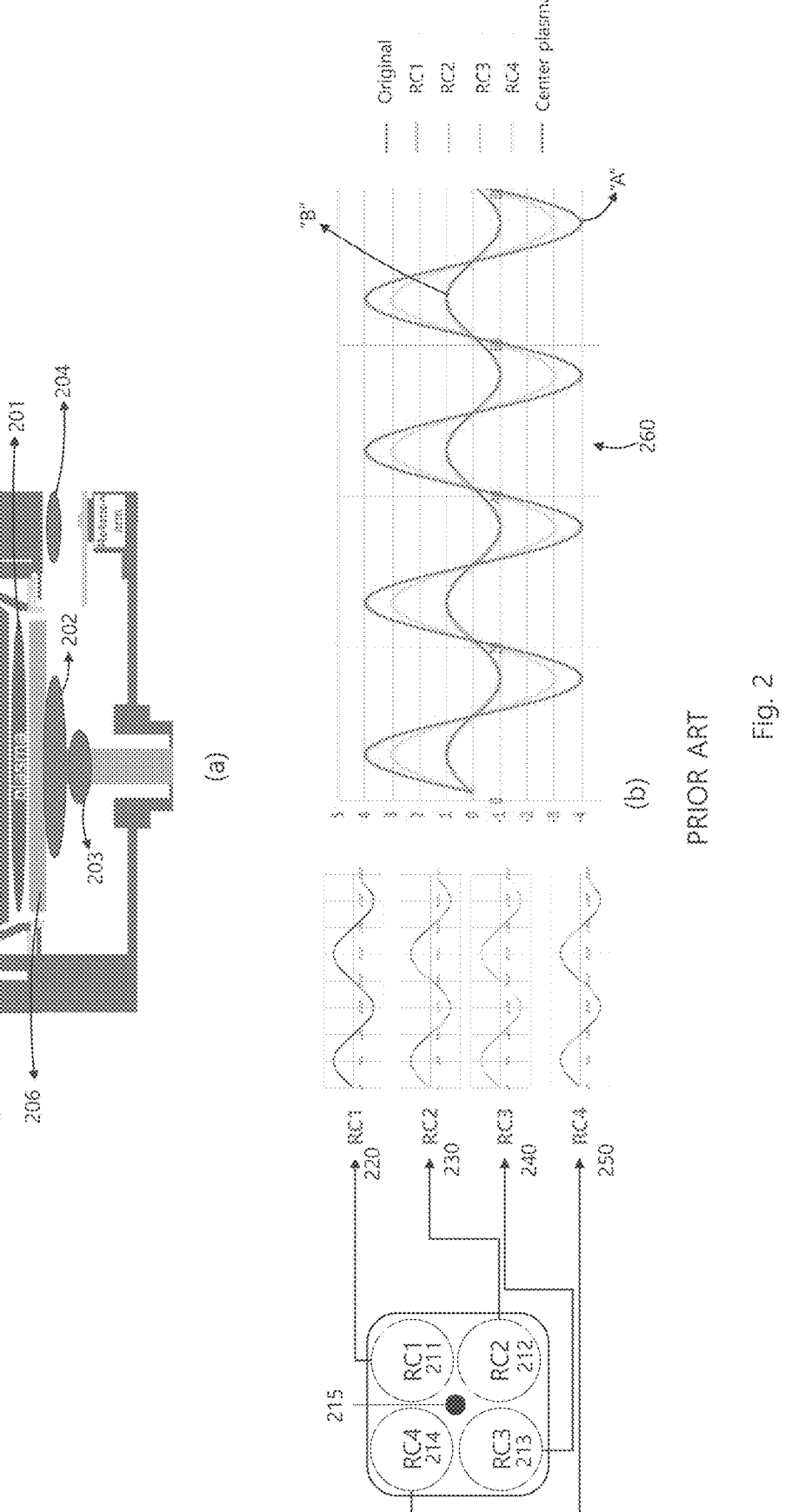
FIG. 2 illustrates a sectional view of a prior art reaction chamber and the positions of the plasma occurrences in the reaction chamber and illustrates how an original wave "B" is fed into the 4 reaction chambers to make resulting center plasma's wave "A" in a prior art system.

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

As used herein, the term "substrate" may refer to any underlying material or materials, including any underlying material or materials that may be modified, or upon which, a device, a circuit, or a film may be formed. The "substrate" may be continuous or non-continuous; rigid or flexible; solid or porous; and combinations thereof. The substrate may be in any form, such as a powder, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide.

For example, a substrate in the form of a powder may have applications for pharmaceutical manufacturing. A porous substrate may comprise polymers. Examples of workpieces may include medical devices (for example, stents and syringes), jewelry, tooling devices, components for battery manufacturing (for example, anodes, cathodes, or separators) or components of photovoltaic cells, etc.

A continuous substrate may extend beyond the bounds of a process chamber where a deposition process occurs. In some processes, the continuous substrate may move through the process chamber such that the process continues until the end of the substrate is reached. A continuous substrate may be supplied from a continuous substrate feeding system to allow for manufacture and output of the continuous substrate in any appropriate form.

Non-limiting examples of a continuous substrate may include a sheet, a non-woven film, a roll, a foil, a web, a flexible material, a bundle of continuous filaments or fibers (for example, ceramic fibers or polymer fibers). Continuous substrates may also comprise carriers or sheets upon which non-continuous substrates are mounted.

As used herein, the term "about," in relation to a value of degrees, encompasses the recited value within (i.e. plus or minus) 10 degrees, or within 5 degrees, or within 2 degrees, or within 0 degrees.

The illustrations presented herein are not meant to be actual views of any particular material, structure, or device, but are merely idealized representations that are used to describe embodiments of the disclosure.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

FIG. 1 illustrates the overview of the present disclosure's apparatus.

The platform 100 may contain 4 reaction chambers (RC) RC1 101, RC2 102, RC3 103, and RC4 104. The four reaction chambers 101, 102, 103, 104 may process substrates with plasma.

Exemplary platforms, and their constituent reaction chambers, are commercially available from ASM International N.V. under the tradename XP8® QCM.

The plasma used in the RCs may be generated in a generator or plasma generator 110. The generated plasma or plasma power may be transmitted to each of the RCs via coupled lines. In some embodiments, the frequency of the plasma power in all reaction chambers is between about 40 MHz and 80 MHz, or between about 50 MHZ and about 70 MHz, or about 60 MHz.

A control circuit 120 may be connected to the generator or plasma generator 110 and may also control the phase of the plasma or plasma power provided to each of the reaction chambers, independently of each other.

Figure 3:
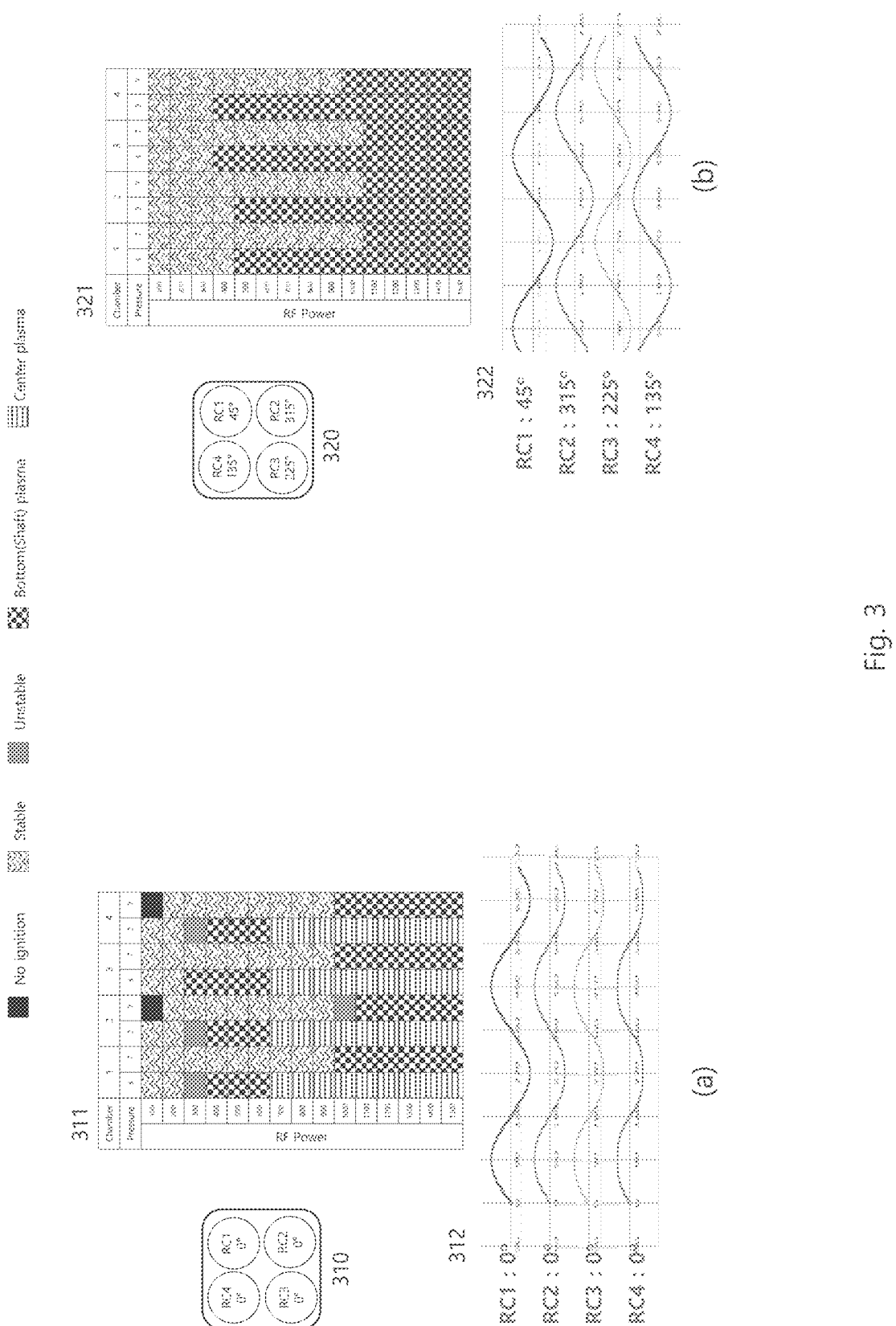
FIG. 3 illustrates how the plasma power are reflected in the 4 reaction chambers in conventional setup and illustrates the resulting plasma power and the advantage of the present disclosure's apparatus according to an embodiment of the present disclosure.

For example, as shown in portion (b) of FIG. 3, RC1 is fed with a plasma or plasma power with 45° phase and in counterclockwise direction, RC4 is fed with a plasma or plasma power with 135°, 90° shift from that of RC1, and RC3 is fed with a plasma or plasma power with 225°, 90° shift from that of RC4, and RC2 is fed with a plasma or plasma power with 315°, 90° shift from that of RC3.

With this phase shift among the RCs, a destructive interference may be created so that there would be no "center plasma" generated from constructive interference.

Another example, though not illustrated, would be a situation when RC1 is fed with a plasma or plasma power with 0° phase and in clockwise direction. RC2 is fed with a plasma or plasma power with 90° (90° shift from that of RC1). RC3 is fed with a plasma or plasma power with 180° (90° shift from that of RC2). RC4 is fed with a plasma or plasma power with 270°, a 90° shift from that of RC3.

This exemplary phase shift among the RCs would result in no "center plasma" from constructive interference because the phase difference would cause a destructive interference in the place of the "center plasma".

Figure 4:
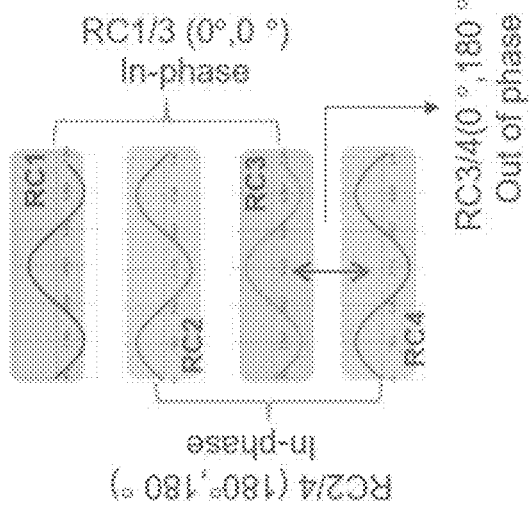
FIG. 4 illustrates an apparatus and plasma power phase shifts according to an embodiment of the present disclosure.
Figure 4:
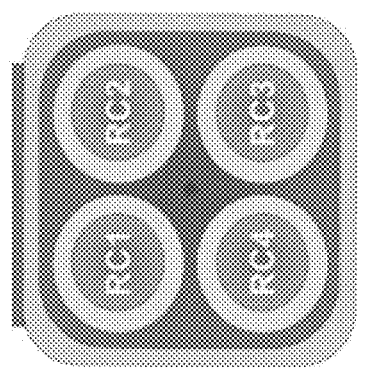

In another example, as shown in FIG. 4, the plasma power of RC1 and RC3 may be in phase with each other and out of phase by about 180 degrees with the plasma power of RC2 and RC4. Similarly, the plasma power of RC2 and RC4 may be in phase with each other and out of phase with the plasma power of RC1 and RC3. In other words, RC1 and RC3 are fed with a plasma power with no shift (within about 0°) and RC2 and RC4 are fed with a plasma power with an about 180° shift from that of RC1 or RC3.

This phase shift would be applied to an apparatus with more than 4 RCs.

For example, in case of 6 RCs instead of 4, the shifted phase may be 60°, not 90°. Generally, with n RCs disposed in a platform, a phase that need to be shifted to cancel out the "center plasma" effect with a destructive interference may be $(360/n°)$.

This phase shift would be calculated in the control circuit 120 automatically with the number of RCs or would be hard-wired and each phase-shifted plasma or plasma power would be transmitted to each of the RCs just like the 4 RC example.

As shown in portion (b) of FIG. 3 compared with portion (a) of FIG. 3, an embodiment of the present disclosure may show better plasma performance.

As shown in 320 of portion (b) of FIG. 3, the plasma or plasma power is shifted by 90 degrees and the starting phase would be 45 degrees in RC1 and in clockwise the RCs may be fed with a plasma or plasma power increasing phase by 90 degrees from the previous RC.

As shown in portion (a) of FIG. 3's table 311, the plasma performance in each of the RCs is diminished without phase shifting. Even "no ignition" and "unstable" plasma conditions exist and in many power ranges, the "center plasma" may exist resulting in instabilities within the plasma.

On the other hand, as shown in portion (b) of FIG. 3's table 321, even though about half of the status in the power ranges are "bottom/shaft plasma", the rest are "stable". Moreover, due to destructive interference among the RCs, "center plasma" as well as "no ignition" and "unstable" does not exist in the table 321.

As shown, just by shifting the phase of the plasma or plasma power provided into each RCs individually, the plasma efficiency may improve greatly as well as substrate quality after processing.

The control circuit 120 may also change the plasma phases provided to each of the reaction chambers when the plasma or plasma power is being provided. When the plasma or plasma power's 90 degrees shift of portion (b) of FIG. 3 may not result in enough efficiency as expected, the plasma shift or phase shift may be is changed in real-time during operation of the reaction chambers such as 60 degrees of starting phase in RC1 and increasing 90 degrees phases from the previous RC in clockwise RC order.

The specific plasma power phase shifts needed to minimize parasitic or unwanted plasma and achieve plasma uniformity may be different depending on the unique configuration of platform and reaction chambers. Not to be bound by theory, the specific optimal plasma power phase shifts for each chamber may be dependent on the number and spatial configuration of the reaction chambers, the relative amplitude and frequency of the plasma power, and any phase delay from the RF delivery path of the individual chambers.

In some embodiments, such as the configuration of reaction chambers in FIG. 1, or in a quad chamber module as part of a system commercially available from ASM International N.V. under the tradename XP8® QCM, an optimal plasma phase shift may vary from the disclosed plasma phase shifts recited above. In some of these embodiments, RC2 may have an about 195° plasma power phase shift from the phase of plasma power of RC1, RC3 may have an about 22° plasma power phase shift from the phase of plasma power of RC1, and RC4 may have an about 198° plasma power phase shift from the phase of plasma power of RC1.

The above-described arrangement of apparatus is merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

The invention claimed is:

1. A substrate processing system, the system comprising:
   a first reaction chamber, a second reaction chamber, a third reaction chamber, and a fourth reaction chamber disposed on a platform, wherein each of the reaction chambers is configured to process substrates;
   at least one generator coupled to the first reaction chamber, second reaction chamber, third reaction chamber, and fourth reaction chamber, wherein the system is configured to provide a first plasma power comprising a first phase to the first reaction chamber, a second plasma power comprising a second phase to the second reaction chamber, a third plasma power comprising a third phase to the third reaction chamber, and a fourth plasma power comprising a fourth phase to the fourth reaction chamber; and
   at least one control circuit connected to the at least one generator, wherein the at least one control circuit is configured to independently control the first phase, the second phase, the third phase, and the fourth phase;
   wherein the first and third phases are within 10 degrees, and wherein the second and fourth phases are between 170 and 190 degrees offset from the first phase.

2. The substrate processing system according to claim 1, wherein the at least one control circuit is further configured to control the first, second, third, and fourth phases in real-time.

3. The substrate processing system according to claim 1, wherein the reaction chambers are arranged on the platform in the shape of a square with the first reaction chamber adjacent to the second reaction chamber and the fourth reaction chamber.

4. The substrate processing system according to claim 1, wherein the second and fourth phases are between 175 and 185 degrees offset from the first phase.

5. A substrate processing system, the system comprising:
   a first reaction chamber, a second reaction chamber, a third reaction chamber, and a fourth reaction chamber disposed on a platform, wherein each of the reaction chambers is configured to process substrates;
   at least one generator coupled to the first reaction chamber, second reaction chamber, third reaction chamber, and fourth reaction chamber, wherein the system is configured to provide a first plasma power comprising a first phase to the first reaction chamber, a second plasma power comprising a second phase to the second reaction chamber, a third plasma power comprising a third phase to the third reaction chamber, and a fourth plasma power comprising a fourth phase to the fourth reaction chamber; and
   at least one control circuit connected to the at least one generator, wherein the at least one control circuit is configured to independently control the first phase, the second phase, the third phase, and the fourth phase;
   wherein the second phase is between 185 to 205 degrees offset from the first phase.

6. The substrate processing system according to claim 5, wherein the third phase is between 12 and 32 degrees offset from the first phase.

7. The substrate processing system according to claim 6, wherein the fourth phase is between 188 and 208 degrees offset from the first phase.

8. The substrate processing system according to claim 5, wherein the at least one control circuit is further configured to control the first, second, third, and fourth phases in real-time.

9. The substrate processing system according to claim 5, wherein the reaction chambers are arranged on the platform in the shape of a square with the first reaction chamber adjacent to the second reaction chamber and the fourth reaction chamber.

10. The substrate processing system according to claim 5, wherein the second phase is between 190 to 200 degrees offset from the first phase.

11. The substrate processing system according to claim 10, the third phase is between 17 and 27 degrees offset from the first phase.

12. The substrate processing system according to claim 11, wherein the fourth phase is between 193 and 203 degrees offset from the first phase.

13. A substrate processing system, the system comprising:

a first reaction chamber, a second reaction chamber, a third reaction chamber, and a fourth reaction chamber disposed on a platform, wherein each of the reaction chambers is configured to process substrates;

at least one generator coupled to the first reaction chamber, second reaction chamber, third reaction chamber, and fourth reaction chamber, wherein the system is configured to provide a first plasma power comprising a first phase to the first reaction chamber, a second plasma power comprising a second phase to the second reaction chamber, a third plasma power comprising a third phase to the third reaction chamber, and a fourth plasma power comprising a fourth phase to the fourth reaction chamber; and at least one control circuit connected to the at least one generator, wherein the at least one control circuit is configured to independently control the first phase, the second phase, the third phase, and the fourth phase;

wherein the second phase is between 80 and 100 degrees offset from the first phase, the third phase is between 170 and 190 degrees offset from the first phase, and the fourth phase is between 260 and 280 degrees offset from the first phase.

14. The substrate processing system according to claim 13, wherein the at least one control system is further configured to control the first, second, third, and fourth phases in real-time.

15. The substrate processing system according to claim 13, wherein the reaction chambers are arranged on the platform in a shape of a square.

16. The substrate processing system according to claim 13, wherein the second phase is between 85 to 95 degrees offset from the first phase, the third phase is between 175 and 185 degrees offset from the first phase, and the fourth phase is between 265 and 275 degrees offset from the first phase.

* * * * *